(12) United States Patent
Georgakos et al.

(10) Patent No.: US 6,212,102 B1
(45) Date of Patent: Apr. 3, 2001

(54) EEPROM AND METHOD FOR TRIGGERING THE EEPROM

(75) Inventors: Georg Georgakos, Fraunberg; Martin Bloch, Gröbenzell; Kai Kasprick; Thomas Kern, both of München; Jürgen Peter, Zorneding; Thomas Piorek, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/250,364

(22) Filed: Feb. 12, 1999

(30) Foreign Application Priority Data

Feb. 12, 1998 (DE) .............................................. 198 05 787

(51) Int. Cl.$^7$ .................................................... G11C 16/04
(52) U.S. Cl. ............................... 365/185.18; 365/185.23; 365/185.26
(58) Field of Search ................... 365/185.18, 185.26, 365/185.23, 185.27, 185.28

(56) References Cited

U.S. PATENT DOCUMENTS

| | | | |
|---|---|---|---|
| 4,912,749 | * 3/1990 | Maruyama et al. | 365/185 |
| 4,996,669 | * 2/1991 | Endoh et al. | 365/185 |
| 5,050,125 | * 9/1991 | Momodomi et al. | 365/185 |
| 5,251,171 | * 10/1993 | Yamauchi | 365/185 |
| 5,687,118 | 11/1997 | Chang | 365/185.19 |
| 5,706,228 | 1/1998 | Chang et al. | 365/185.18 |
| 5,978,265 | * 11/1999 | Kirisawa et al. | 365/185.17 |

OTHER PUBLICATIONS

"A 2–Transistor Source–select (2TS) Flash EEPROM for 1.8V–Onlly Applications", Wei–Hua Liu et al., Semiconductor Technologies Laboratory, Motorola Inc., Austin Texas, pp. 1–3.

* cited by examiner

Primary Examiner—Richard Elms
Assistant Examiner—Hien Nguyen
(74) Attorney, Agent, or Firm—Herbert L. Lerner; Laurence A. Greenberg; Werner H. Stemer

(57) ABSTRACT

An EEPROM with two-transistor memory cells with source-side selection, and a method for triggering such a EEPROM are described. The EEPROM and the method are distinguished in that the programming voltage required to program a memory cell is delivered via a source line. As a result the EEPROM can be protected in a simple way against unintended loss of the data stored in it.

6 Claims, 3 Drawing Sheets

EEPROM AND METHOD FOR TRIGGERING THE EEPROM

BACKGROUND OF THE INVENTION

FIELD OF THE INVENTION

The present invention relates to an EEPROM formed of a plurality of memory cells, which are programmable, readable and erasable via selection, control, bit and source lines. Each of the memory cells contains a memory transistor and a selection transistor connected in series with the memory transistor. A drain terminal of the memory transistor is connected to the bit line and the source terminal of the selection transistor is connected to the source line.

EEPROMs are nonvolatile, electrically programmable and electrically erasable memories. The nucleus of each memory cell of an EEPROM is its memory transistor.

The memory transistor, like "normal" transistors, that is, transistors without a memory, has a source segment embedded in a substrate, a drain segment also embedded in the substrate, and a (control) gate segment (control gate) disposed above the substrate. Unlike normal transistors, a so-called floating gate is electrically insulated from the substrate and the control gate by insulation layers provided between the substrate and control gate.

To prevent other (adjacent) memory cells from being read out, overwritten and/or erased when a particular memory cell is being read, written on and/or erased, each memory cell includes a second transistor, more specifically a selection transistor, which is formed by a "normal" transistor.

Memory cells of this type can be programmed, read out and erased via the selection, control, bit and source lines. The selection line is connected to a gate portion of the selection transistor. The control line formed by a so-called word line is connected to a control gate of the memory transistor. The bit line is connected to a drain portion of the selection transistor, and the source line is connected to the source portion of the memory transistor.

Via the selection, the control, the bit and the source lines, in the programming, reading and erasing processes, voltages are typically applied to the corresponding (selected) memory cells and the memory cells not to be addressed (not selected). This requires a relatively high voltage at the gate of the selection transistor. This high voltage (needed constantly or frequently) prevents the EEPROM from being capable of being operated with a very low supply voltage, for which there is widespread demand; in any case, it is not possible to lower the supply voltage to below 2.5 V.

Solutions proposed to provide an EEPROM operable with a low supply voltage have resulted in complicated programming procedures that may cause stored information to be lost.

SUMMARY OF THE INVENTION

It is accordingly an object of the invention to provide an EEPROM and a method for triggering the EEPROM that overcomes the above-mentioned disadvantages of the prior art devices and methods of this general type, in which undesired information losses can be reliably prevented in a simple way and a low supply voltage can be used.

With the foregoing and other objects in view there is provided, in accordance with the invention, an EEPROM, including: a plurality of memory cells each having a memory transistor with a drain terminal and a selection transistor with a source terminal connected in series with the memory transistor; a selection line connected to the selection transistor; a control line connected to the memory transistor; a bit line connected to the drain terminal of the memory transistor; a source line connected to the source terminal of the selection transistor, the plurality of memory cells being programmable, readable and erasable via the selection line, the control line, the bit line and the source line; and a control unit connected to the source line for delivering a programming voltage required for programming the plurality of memory cells via the source line.

It is accordingly provided that the control unit is configured to deliver the programming voltage required for programming the memory cells via the source line.

As a result, it can be attained that the programming voltage is now applied only to the memory transistors of the memory cells that are selected by the associated selection transistor (by the selection line controlling it). Therefore, in programming, no undesired load shift can take place any longer at the memory transistors of unselected memory cells, or more specifically at the floating gates thereof, and as a result the information stored in the memory transistor can be preserved durably in a way that is clearly simple.

Other features which are considered as characteristic for the invention are set forth in the appended claims.

Although the invention is illustrated and described herein as embodied in an EEPROM and a method for triggering the EEPROM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
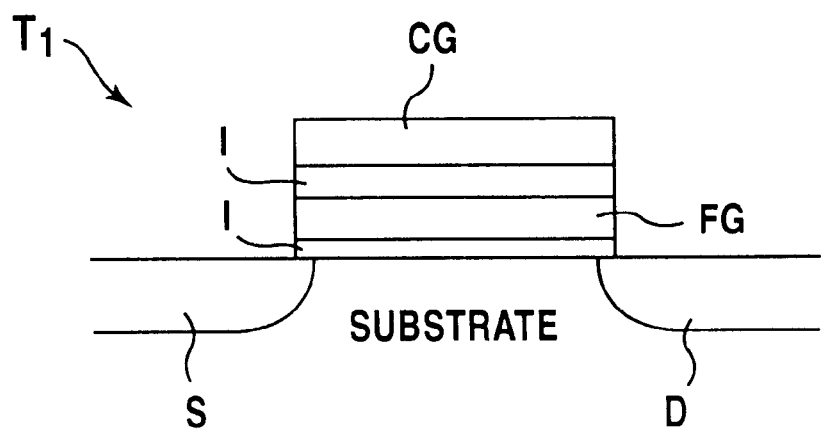
FIG. 1A is a diagrammatic, sectional view of a typical layout of a memory transistor used in memory cells of an EEPROM.

In all the figures of the drawing, sub-features and integral parts that correspond to one another bear the same reference symbol in each case. Referring now to the figures of the drawing in detail and first, particularly, to FIG. 1A, there is shown the layout of a memory transistor T1 provided for use in an integrated circuit. The circuit diagram for the memory transistor T1 is shown in FIG. 1B.

Figure 1B:
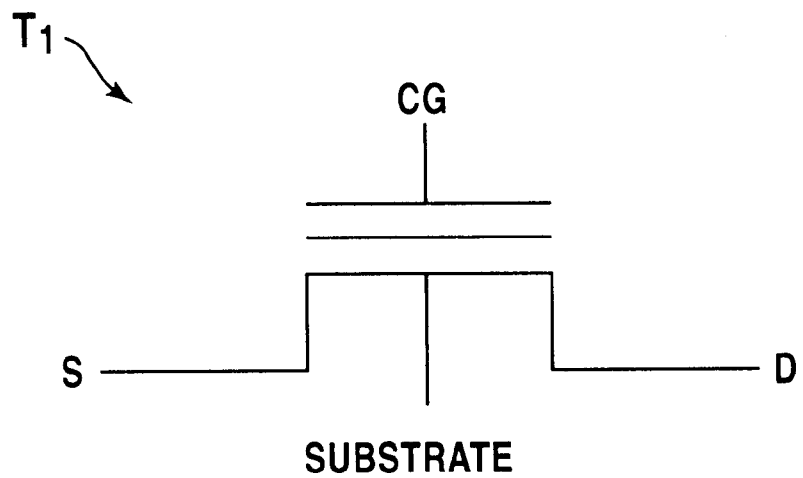
FIG. 1B is a diagrammatic illustration of a circuit symbol for the memory transistor of FIG. 1A.

As is shown in FIG. 1A, the memory transistor, like "normal" transistors, that is, transistors without memory, has a source segment S embedded in a substrate, a drain segment D also embedded in the substrate, and a (control) gate segment (control gate) CG disposed above the substrate. Unlike normal transistors, a so-called floating gate FG is electrically insulated from the substrate and the control gate CG by insulation layers I provided between the substrate and control gate CG.

The additional floating gate FG is charged or discharged under certain circumstances by known phenomenas such as CHE or Fowler-Nordheim tunnels and maintains the resultant charge state until the next charging or discharging operation. The charges stored in the floating gate FG of the memory transistor affect the behavior of the memory transistor (and especially its cut off voltage) and thus represent durable (nonvolatile) information that is ascertainable (readable) at any time.

To prevent other (adjacent) memory cells from being read out, overwritten and/or erased when a particular memory cell is being read, written on and/or erased, each memory cell includes a second transistor, more specifically at the aforementioned selection transistor, which is formed by a "normal" transistor.

Figure 2:
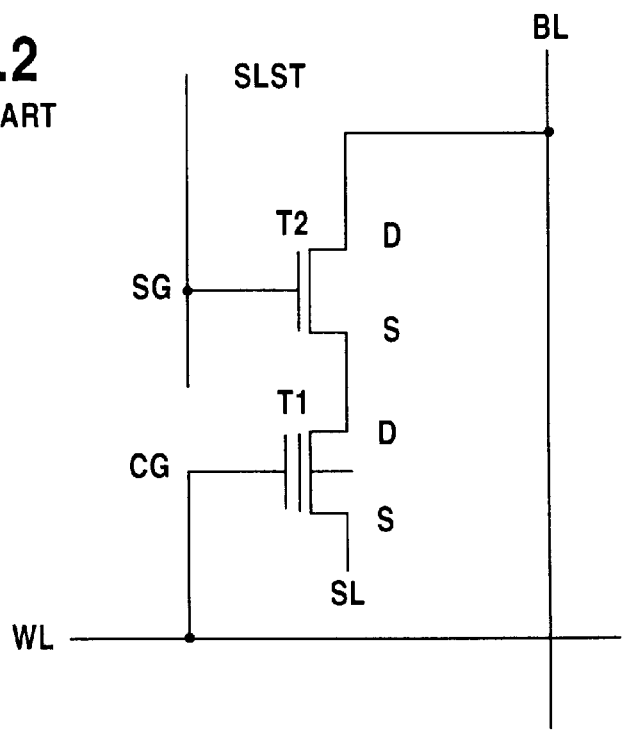
FIG. 2 is a schematic illustration of the layout of a conventional EEPROM memory cell.

The memory transistor T1 and the selection transistor (hereinafter designated T2) were originally wired as shown in FIG. 2.

Memory cells of this type can be programmed, read out and erased via a selection line SLST, a control or word line WL, a bit line BL and a source line SL. The selection line SLST is connected to a gate portion SG of the selection transistor T2. The control line formed by a so-called word line WL is connected to a control gate CG of the memory transistor T1. The bit line BL is connected to a drain portion of the selection transistor T2, and the source line SL is connected to the source portion of the memory transistor T1.

Via the selection line SLST, the control or word line WL, the bit line BL and the source line SL, in the programming, reading and erasing processes, the voltages listed (in volts) in Table 1 below are typically applied to the corresponding (selected) memory cells and the memory cells not to be addressed (not selected):

TABLE 1

|  | CG | SG | BL | SL |
|---|---|---|---|---|
| Programming (selected/unselected) | −11/0 | 10/−11 | 5/0 | 0 |
| Reading | 2.5 | 5 | 1.5 | 0 |
| Erasing (selected/unselected) | 16/0 | 0/16 | 0 | 0 |

As can be seen from Table 1 above, the selection transistor T2, in reading, must switch the reading voltage of 1.5 V, delivered to it via the bit line BL, through to the memory transistor T1. This requires a relatively high voltage at the gate SG of the selection transistor T2. This high voltage (needed constantly or frequently) prevents the EEPROM from being capable of being operated with a very low supply voltage, for which there is widespread demand; in any case, it is not possible to lower the supply voltage to below 2.5 V.

The problem can be solved, if, as proposed in the paper entitled "A 2-Transistor Source-Select (2TS) Flash EEPROM for 1.8-V-Only Applications" by Wei-Hua Liu et al., in IEEE Non-Volatile Semiconductor Memory Workshop, Paper 4.1, 1997, the memory transistor T1 and the selection transistor T2 are transposed; that is, if the selection transistor T2 is placed on the source side of the memory transistor T1.

Figure 3:
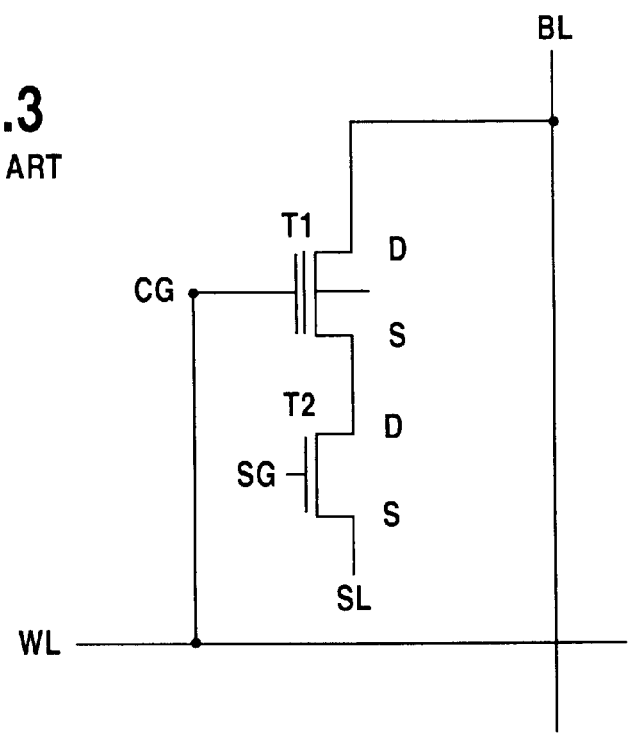
FIG. 3 is a schematic illustration of a memory cell that is modified compared with what is shown in FIG. 2 but is known in the prior art.

A memory cell of this kind is shown in FIG. 3.

For programming, reading and erasing, the voltages listed (in volts) in Table 2 below are typically applied via the selection line SLST, the control or word line WL, the bit line BL and the source line SL to the memory cells to be addressed (selected) and the memory cells not to be addressed (not selected), where VDD represents the supply voltage of the EEPROM:

TABLE 2

|  | CG | SG | BL | SL |
|---|---|---|---|---|
| Programming (selected memory cell) | −12 | 0 | 5 | 0 |
| Programming (unselected column) | −12 | 0 | 0 | 0 |
| Programming (unselected line) | 3.5 | 0 | 0 | 0 |
| Reading | 1 | VDD | 1 | 0 |
| Erasing (selected/unselected) | 14.5 | VDD | 0 | 0 |

As can be seen from Table 2 above and as can be concluded upon observation of the layout (shown in FIG. 3), of the memory cell in question, in reading "only" the 0 V of the source line SL has to be switched through by the selection transistor T2, and as a result the voltage to be applied to the gate terminal SG of the selection transistor T2, at approximately 1 V (the so-called threshold voltage $V_{th}$), can be very low.

It is thus possible to achieve EEPROMs with low supply voltages.

However, in the memory cell of FIG. 3, the programming proves to be more complicated. That is, in programming, the programming voltage of 5 V is delivered via the bit line BL to the memory transistors T1 of the unselected memory cells as well. This leads to a malfunction known as a "drain disturbance", which is expressed in a change in charge at the insulated floating gates FG of the memory transistors T1, which if its last long enough or occurs often enough can cause the information that can be read out of the memory cells to change, or in other words can cause stored information to be lost.

In accordance with the above paper by Wei-Hua Liu et al, this effect can be limited by applying a compensation voltage to the unselected word lines WL (see Table 2) ; however, it cannot be made to vanish entirely, which can be appreciated as a serious disadvantage.

Figure 4:
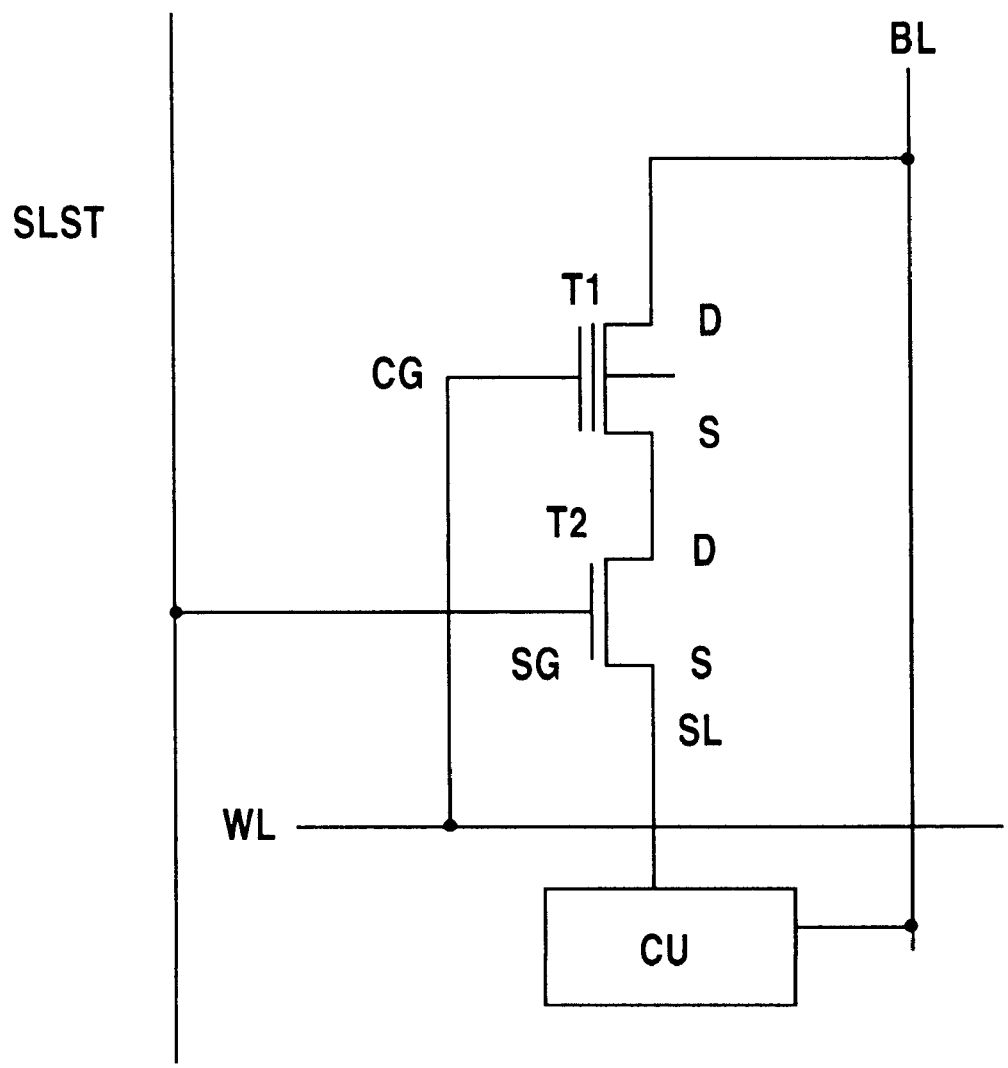
FIG. 4 is a schematic illustration of the memory cell according to the invention.

In FIG. 4 there is shown an EEPROM having a plurality of memory cells disposed in lines and columns, that is, in a matrix. Each of the memory cells includes the memory transistor T1 and the selection transistor T2 which are wired as shown in FIG. 4.

More specifically, the memory transistor T1 and the selection transistor T2 are connected in series, and the selection transistor T2 is located on the source side of the memory transistor T1, while the selection line SLST is connected with the gate portion SG of the selection transistor T2. The control line formed by the word line WL is connected to the control gate portion CG of the memory transistor T1. The bit line BL is connected to the drain portion of the memory transistor T1, and the source line SL is connected to the source portion of the selection transistor T1.

However, the source line SL connected to the source terminal of the selection transistor T2, unlike the prior art, is no longer permanently connected to a ground potential, but instead is configured to be applied to potentials other than 0 V.

This possibility is made use of in the example in question for programming the EEPROM. It can be seen from the following Table 3, in which VDD again represents the supply voltage of the EEPROM. The voltages (in volts) are preferably applied to the selected and unselected memory cells via the selection line SLST, the control or word line WL, the bit line BL and the source line SL for programming, reading and erasing. In the voltage values given numerically, it should be taken into account that these are merely examples to illustrate the approximate orders of magnitude and relationships. The individual voltages may differ considerably from the values shown, depending on the technology employed, among other factors.

TABLE 3

|  | CG | SG | BL | SL |
|---|---|---|---|---|
| Programming (selected/unselected) | −11/0 | 10/0 | 0 | 5/0 |
| Reading | VDD | VDD | 1.5 | 0 |
| Erasing (selected/unselected) | 16/0 | VDD | 0 | 0 |

As can be seen from Table 3, the voltages delivered to the memory cells in their programming via the bit line(s) BL and the source line(s) SL are precisely transposed at the point compared with the prior art. In other words, the programming voltage is no longer delivered to the memory cell via the bit line BL but rather via the source line SL. The voltage applied via the bit line BL can be lowered to 0 V, or, in more general terms, a very low voltage. A control unit CU is connected to the source line SL and provides the programming voltage.

The low voltage that is delivered to the memory transistor T1 via the bit line BL connected directly to it cannot cause any charge changes, or at most can cause only negligibly slight charge changes, in the memory transistor T1 or more specifically in its floating gate. The occurrence of the aforementioned drain disturbance or similar effects, or more specifically the tripping of these effects, is thus precluded by voltages applied via the bit line BL.

The (high) voltage which is now delivered via the source line SL is equally unable to trip undesired disruptions of the type mentioned. That is, the source line SL is connected not directly, but rather "only" via the selection transistor T2 to the memory transistor T1, and as a result the memory transistor T1 can be acted upon by the voltage carried via the source line SL only if and as long as the selection transistor T2 is in the conductive state (if and as long as the applicable memory cell is selected via the selection line SLST connected to the gate terminal SG of the selection transistor T2. In other words, in the memory transistors T1 of unselected memory cells, the high voltage now carried via the source line SL cannot cause any charge changes in the floating gate.

Another advantage of the EEPROM, and the method for triggering the EEPROM, described here is that the programming voltage no longer needs to be applied to the memory cell over the same line as the reading voltage required for reading out the EEPROM.

Specifically, while the programming voltage is now carried via the source line SL, a reading voltage continues to be carried via the bit line BL (see Table 3 above). This affords the possibility of optimizing the reading and the programming of the EEPROM independently of one another. It proves in this respect to be advantageous if the bit lines BL are optimized for low voltages and short access times, while the source line(s) are optimized for high voltages. The control unit CU is also connected to the bit line BL for providing the reading voltage.

Particularly if the memory cells are selectable only in units that include many memory cells (for instance, in units of long memory cell matrix lines), it proves to be advantageous if the source line SL, which as a rule is common to all the memory cells, is replaced by a plurality of separate, independently triggerable source lines, and each of the many source lines is assigned to only single memory cells or only to a few memory cells (that is, a few memory cells within one memory cell matrix line). As a result, it can be attained that individual memory cells, or units including only a few memory cells, can be programmed selectively from among the memory cells of the EEPROM in question.

By the above-described EEPROM and the above-described method for triggering the EEPROM, it is possible regardless of the details of the practical embodiment to achieve an EEPROM that can be operated with a low supply voltage in a simple way and that is reliably protected against an unintended loss of the information stored in it.

We claim:
1. An EEPROM, comprising:
   a plurality of memory cells each having a memory transistor with a drain terminal and a selection transistor with a source terminal connected in series with said memory transistor;
   a selection line connected to said selection transistor;
   a control line connected to said memory transistor;
   a bit line connected to said drain terminal of said memory transistor;
   a source line connected to said source terminal of said selection transistor, said plurality of memory cells being programmable, readable and erasable via said selection line, said control line, said bit line and said source line; and
   a control unit connected to said source line for delivering a programming voltage required for programming said plurality of memory cells via said source line.

2. The EEPROM according to claim 1, wherein said source line is a plurality of source lines each connected separately to one of an individual memory cell of said plurality of memory cells and a group of memory cells of said plurality of memory cells.

3. The EEPROM according to claim 2, wherein said plurality of source lines are high voltage source lines for applying high voltages to said plurality of memory cells.

4. The EEPROM according to claim 1, wherein said control unit is connected to said bit line for delivering a reading voltage to said bit line for reading out said plurality of memory cells.

5. The EEPROM according to claim 1, wherein said bit line is a low voltage bit line for applying low voltages rapidly to said plurality of memory cells.

6. An improved method for triggering an EEPROM having a plurality of memory cells which are programmable, readable and erasable via a selection line, a control line, a bit line and a source line, each of the plurality of memory cells having a memory transistor and a selection transistor connected in series with the memory transistor, and a drain terminal of the memory transistor connected to the bit line and a source terminal of the selection transistor connected to the source line, the improvement which comprises:
   delivering a programming voltage required for programming the plurality of memory cells via the source line.

* * * * *